United States Patent [19]
Roudeski

[11] Patent Number: 5,629,571
[45] Date of Patent: May 13, 1997

[54] THYRISTOR LOAD DETECTOR

[75] Inventor: Charles A. Roudeski, Springfield, Ohio

[73] Assignee: Grimes Aerospace Company, Urbana, Ohio

[21] Appl. No.: 133,969

[22] Filed: Oct. 8, 1993

[51] Int. Cl.$^6$ .................................................. H01H 83/20
[52] U.S. Cl. ........................ 307/130; 327/438; 327/440; 363/56; 324/158.1
[58] Field of Search .................... 307/130; 327/438, 327/440; 363/56; 340/653; 324/158

[56] References Cited

U.S. PATENT DOCUMENTS

| | | | |
|---|---|---|---|
| 3,946,293 | 3/1976 | Feld | 318/227 |
| 4,325,009 | 4/1982 | Morehouse et al. | 361/93 |
| 4,358,729 | 11/1982 | Hart | 323/322 |
| 4,366,435 | 12/1982 | Hyodo | 324/158 SC |
| 4,399,395 | 8/1983 | Espelage | 318/803 |
| 4,571,668 | 2/1986 | Azusawa et al. | 363/81 |
| 4,891,571 | 1/1990 | Wong | 323/322 |
| 4,894,648 | 1/1990 | Talbot | 340/825.06 |
| 5,003,455 | 3/1991 | Miller | 363/87 |
| 5,057,987 | 10/1991 | Kumar et al. | 363/58 |
| 5,115,387 | 5/1992 | Miller | 363/54 |

*Primary Examiner*—William M. Shoop, Jr.
*Assistant Examiner*—Albert Paladini
*Attorney, Agent, or Firm*—Standley & Gilcrest

[57] ABSTRACT

A method is described in which load current present in a thyristor device may be detected by monitoring the characteristic voltage found on the gate of the thyristor. Load status information may be used in various ways such as, to turn off the output, to signal a load voltage, or to act as a lamp-fail reset on an aircraft passenger reading light.

8 Claims, 2 Drawing Sheets

THYRISTOR LOAD DETECTOR

BACKGROUND AND SUMMARY OF THE INVENTION

The present invention relates generally to a device for determining if a load is present in an electronic system, and more particularly, to a circuit arrangement which determines if load current is present in a Thyristor device.

A silicon controlled rectifier (SCR), one type of "Thyristor", can be thought of as a switchable diode controlled by a positive gate signal. If connected in series with a supply voltage and load, and the supply voltage is less than the rated voltage of the device and no trigger current is applied to the gate, the Thyristor will remain off. If however, sufficient trigger signal is applied to the gate, the Thyristor's forward voltage will decrease to a value approximating the forward conduction drop of a diode, and the Thyristor will turn on, conducting as a diode. Once on, the Thyristor remains conducting (latches) regardless of the signal applied to the gate. For the Thyristor to be turned off, the anode-to-cathode current must be reduced below the holding current of the device.

Similarly, a triac operates in much the same way, but conducts in both directions when gated on (AC conduction), and accepts either polarity of gate signal.

Prior devices which are or can be used to detect the presence of a load in a system include resistors, current transformers, and Hall detectors; each of which has disadvantages: weight, size, cost, and/or added dissipation.

The present invention enables the detection of load current in a Triac or SCR (or similar Thyristor device) by monitoring the characteristic voltage found on the gate of the device.

Load status information can be used in various ways, for example, to turn off an output, to signal a load fault, etc. When incorporated into a control chip, the circuit of the present invention adds virtually no weight, requires no additional board space, and has negligible cost.

As an example of an application of the present invention, the circuit may be applied to a multi-channel chip that controls aircraft passenger reading lights. The chip removes power from burned-out lamps preferably within one second of their failure. This "lamp-fail reset" feature eliminates many relamping hazards with socket power still applied. Such hazards commonly include electrical shock, burned fingers, socket arcing, and multiple-surges during relamping. The present invention may be especially useful in connection with quartz halogen lamps due to the fact that such lamps operate at extremely high temperatures and pressures, and can even explode if haphazardly inserted into a live socket.

DESCRIPTION OF PREFERRED EMBODIMENT(S)

Figure 1A:
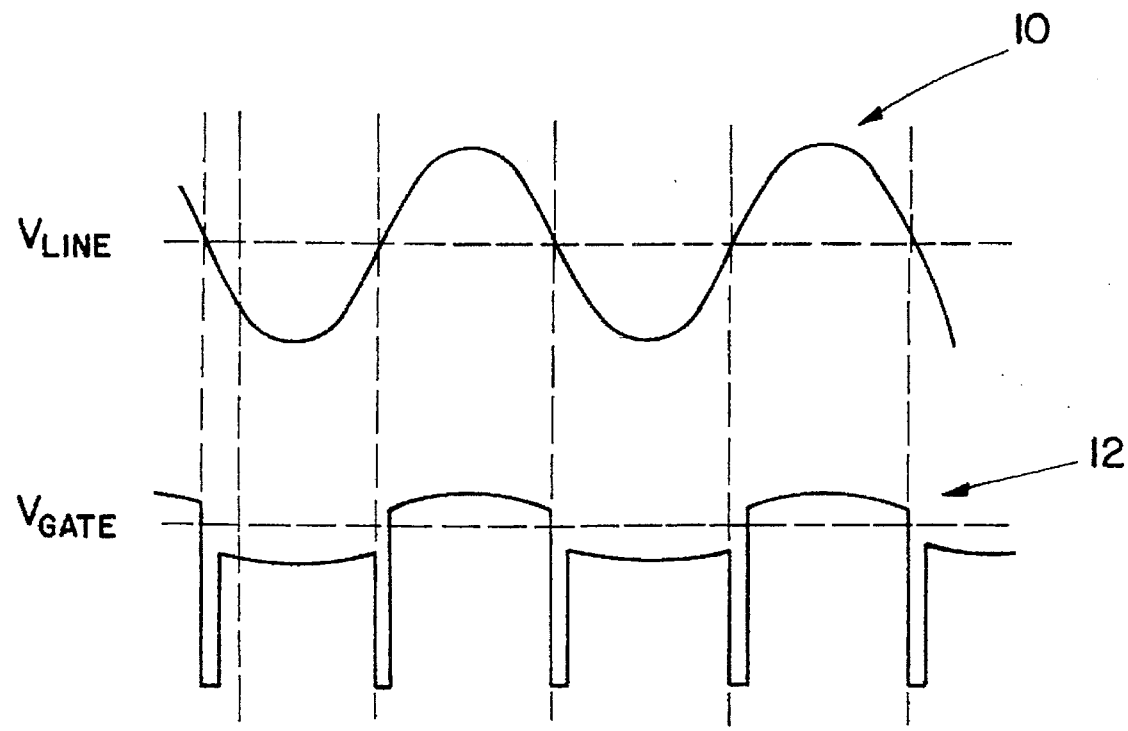
FIG. 1A is a graphical depiction of an AC supply line and the Triac gate signal seen with load current present in the Triac.
Figure 1B:
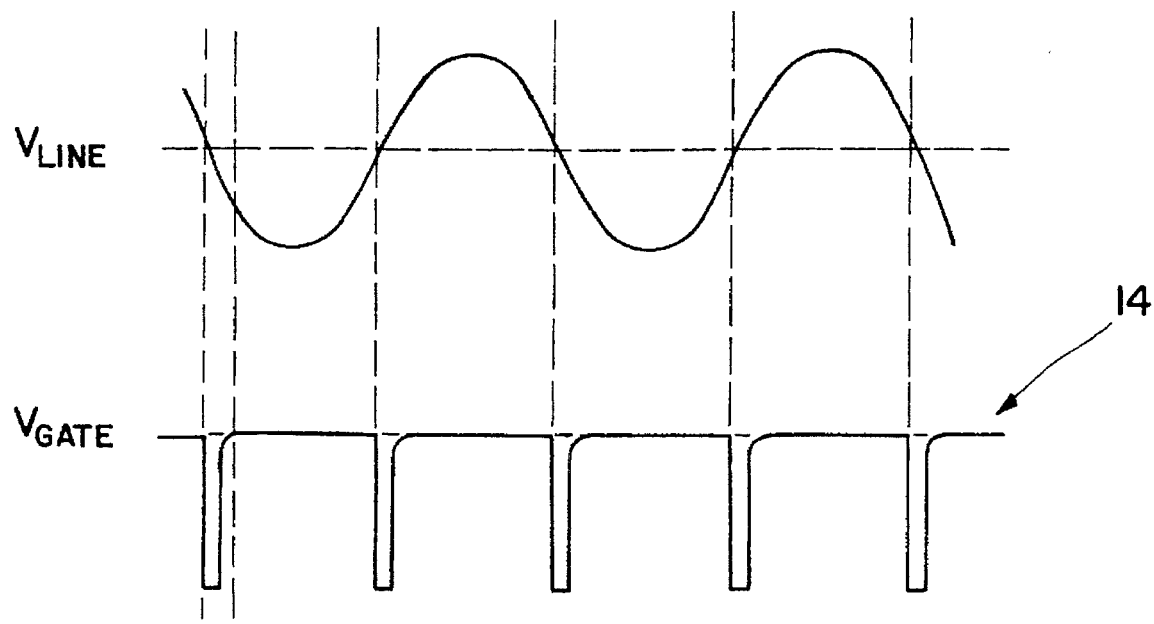
FIG. 1B is a graphical depiction of FIG. 1A when no load current is flowing through the Triac.

Referring now to the drawings, and particularly FIG. 1A, there is shown a typical Triac gate negative voltage pulse 12 as seen by the circuit which is applied at each line voltage zero-crossing. With load current flowing through the Triac, a voltage approximately equal to the Triac's on-state voltage (typically 0.9 Vpk) is present at the gate after pulsing provided the circuit's gate drive transistor is turned off immediately after pulsing to allow evaluation of the gate signal. Referring now to FIG. 1B, if no load current is flowing through the Triac, the gate signal 14 quickly recovers toward zero volts a few microseconds after pulsing.

Figure 2B:
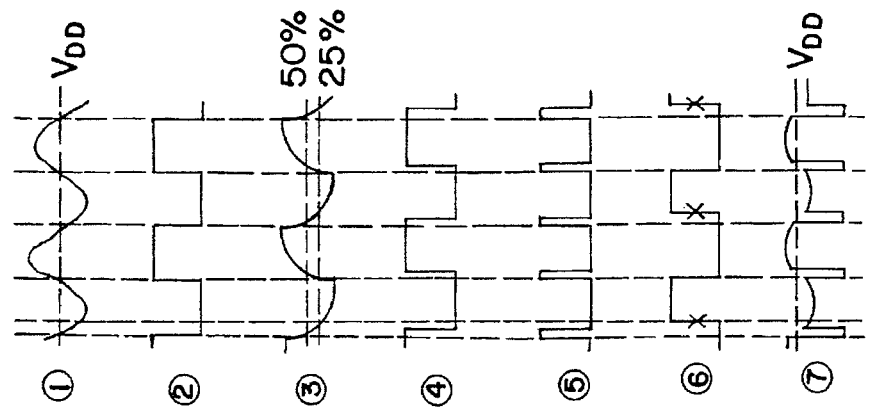
FIG. 2B is a graphical depiction of typical signals occurring at each of seven locations as identified in FIG. 2A.
Figure 2A:
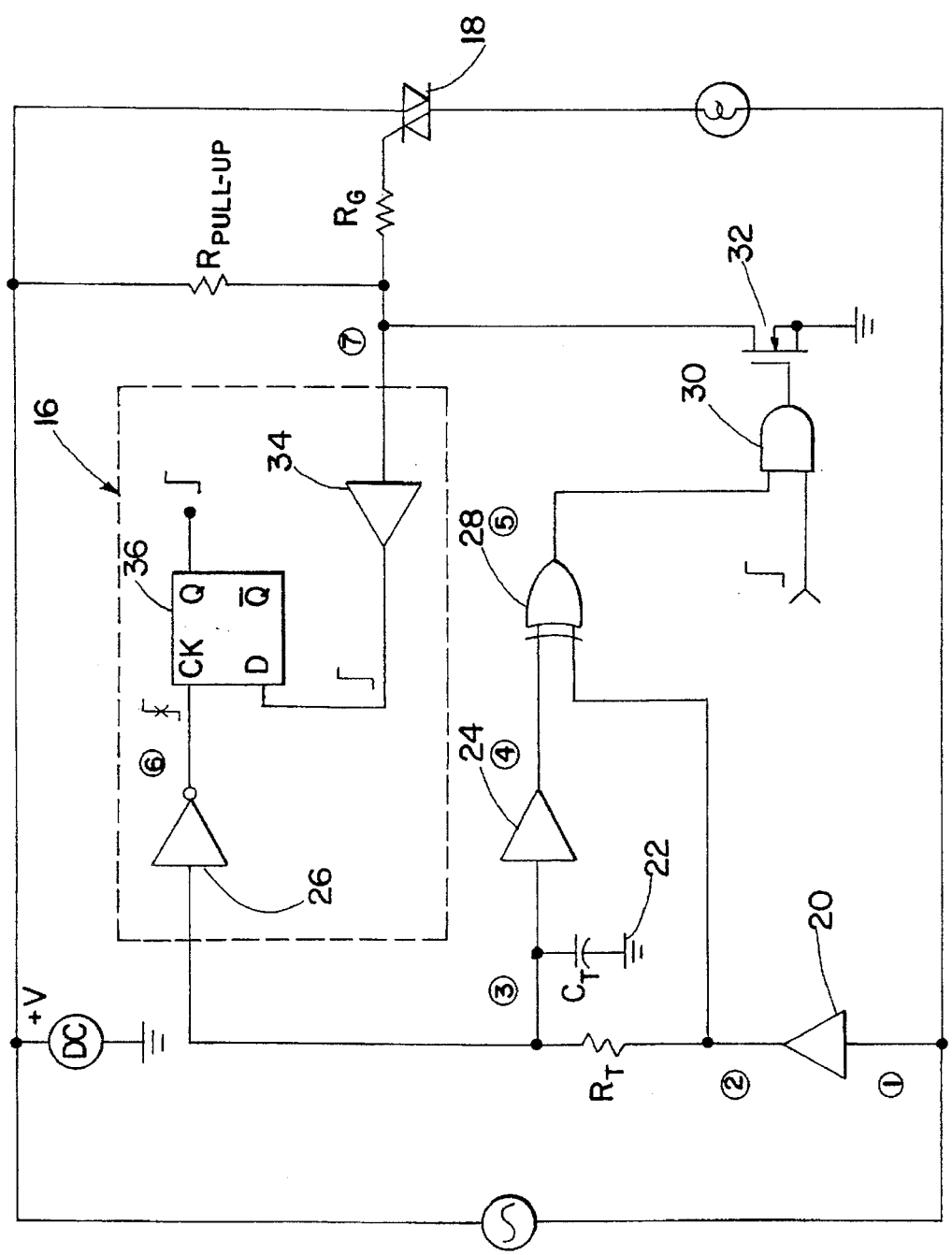
FIG. 2A shows an electrical schematic diagram of one embodiment of the present invention.

As shown in FIG. 2A, one embodiment of the present invention is depicted in a circuit arrangement. The load sensing circuit 16 of the present invention is identified by the dashed box which surrounds it. The Triac 18 is turned on with a pulse typically 100 microseconds in duration applied to the gate as determined by the AC line voltage zero-crossing detector 20. Sampling of the gate voltage is delayed another 100 microseconds after gate pulse termination to give the gate capacitance enough time to discharge from the pulse. One method of deriving anti-coincidence timing for the gate pulse and sampling may be accomplished using an RC delay 22 and two comparators 24, 26 with different thresholds. The first comparator terminates the gate pulse, followed by the second that clocks the gate voltage sample result into a load sense latch. Of course other means could be used to achieve the gate/sample time split, e.g. separate time delays or system clock divide-down circuit.

In FIG. 2B typical signals are depicted at various locations in the circuit of FIG. 2A. For example, the signal identified in FIG. 2B number "1" is taken from location "1" as shown in FIG. 2A.

To avoid false load detection signals due to line glitches, a counter may be incorporated into the circuit, which requires several events before action is taken based on a load detection signal. In another embodiment of the present invention a low-voltage detector may also be incorporated that inhibits sensing when the line voltage is low. This might be required if Thyristor holding current would be inadequate to guarantee latching under light load conditions.

Referring again to FIGS. 2A and 2B, an AC voltage "1" is applied to the input of the zero-crossing detector 20, causing its output to change state with each reversal of the AC line voltage's zero-crossing "2". FIG. 2B shows the timing between the AC line ("waveform "1") and the zero-crossing detector's output (waveform "2"). The phase relationship of these two signals is not critical. In fact the zero-crossing detector's output may be further delayed by any usual means to insure adequate current is developed for thyristor latching with light loads or cold temperatures.

The zero-crossing signal is then applied to an edge detector circuit comprised of XOR gate 28, resistor-capacitor delay network 22, and a voltage detector 24. With each zero-crossing transition, the XOR gate momentarily goes HI producing a gate pulse "5" until the voltage detector's delayed signal arrives "4", approximately 100 us later. The duration of this pulse is controlled by the delay's 22 time constant and the voltage detector's 24 threshold. Ideally fie voltage detector's threshold is 50% of Vdd if the zero-crossing detector's output swings rail-to-rail so that gating pulses are identical in width for either LO-HI or HI-LO transition for each zero-crossing.

Assuming the load is on, control input D is held HI. With this enabling signal present, gating pulses appear at the AND gate 30 output, turning on the transistor 32 for the duration of the pulse. This causes triac gate current to flow from +Vdd, through the triac gate (G on FIG. 2A), resistor Rg and transistor 32 to ground. Once gated, the triac continues conducting until the load current drops below the triac's holding current, near the AC line's zero-crossing.

Conversely, if the load is off, the control input D is held LO. With a logic LO at the AND 30 input, the AND's output remains LO regardless of gate pulses from the XOR 28. As a result, transistor 32 remains off, and the triac 18 remains off.

The detection of current in the triac is determined by looking at the gate's responding voltage state, shortly after triac gating. In the case of AC, for convenience the gate signal is ignored during the positive half cycle, as it is difficult to sense above the logic supply rail.

As discussed, the sampling of the gate voltage must be delayed to give the gate capacitance enough time to discharge from the pulse. To accomplish this, the RC delay 22 signal is also connected to a load sensing circuit 16 whose voltage detector 26 is typically set for 25% of Vdd. This voltage is significantly lower than that of voltage detector 24. The difference of these two voltage thresholds provides two discrete timing events necessary for valid interpretation of the resulting gate voltage. As previously discussed, the gate pulse turns off when the RC voltage reaches 50%, and the gate voltage is sampled when the voltage reaches 25%.

Referring now to FIG. 1A, if current is present in the triac, the triac gate voltage 12 will be approximately 0.75 Vpk above or below the Vdd supply rail after the gating pulse depending on the AC line's phase 10. If however no current is present (FIG. 1B), the gate voltage 14 will quickly rise to the +Vdd level after the gating pulse.

The gate voltage is continuously monitored by the gate's voltage detector 34 whose threshold is typically 0.4 V below the +Vdd logic supply rail. Assuming now that the RC delay has now dropped 25% of Vdd, the voltage detector 26 goes HI (waveform "6" of FIG. 2B), and the D input of the latch 36 is clocked. If current is present in the triac, voltage detector 34 will be LO and a Logic LO will appear at the Q output of the latch 36. If however, current is absent in the triac, voltage detector 34 will be HI the moment voltage detector 26 goes HI and a Logic HI will clocked into the Q output of the latch, indicating that load current is not present.

The present invention is described by way of example only, and various modification and/or alterations will be apparent to those skilled in the art without departing from the scope of the invention as defined by the accompanying claims.

What is claimed is:

1. A method of detecting the presence of load current in a circuit, comprising the steps of:

connecting a thyristor in series with a supply voltage and a load; and monitoring a voltage found on a gate of said thyristor.

2. The method of claim 1, further comprising:

applying a gating pulse to said gate of said thyristor;

limiting the duration of said gating pulse.

3. The method of claim 2, further comprising:

allowing a gate signal to recover from a pulse discharge after termination of said gating pulse.

4. The method of claim 2, further comprising:

delaying said monitoring of said voltage found on said gate to allow a gate capacitance enough time to discharge from said gating pulse.

5. The method of claim 1, further comprising:

latching said voltage found on said gate to retain fault comparator decision until the next sample is received.

6. A method of detecting the presence of load current in a circuit, comprising the steps of:

connecting a thyristor in series with a load and a supply voltage;

monitoring a voltage found on a gate of said thyristor; and sensing said thyristor's gate voltage to determine if its magnitude is sufficient to assume load current is present in said thyristor.

7. The method of claim 6, further comprising:

adding a low voltage detector to said circuit which inhibits sensing of load current when line voltage is low.

8. A circuit for detecting the presence of load current in a circuit having a load and a supply voltage, comprising:

a thyristor connected in series with said load and said supply voltage, said thyristor having a gate;

a gate drive transistor in electrical communication with said gate of said thyristor;

a load sensing circuit in electrical communication with said gate of said thyristor, wherein said load sensing circuit is further comprised of:

a sampling latch in electrical communication with said gate of said thyristor for retaining fault comparator decision until the next sample is received; and wherein said load sensing circuit delays in the monitoring of said gate voltage to allow a gate capacitance on said gate enough time to discharge.

* * * * *

UNITED STATES PATENT AND TRADEMARK OFFICE
CERTIFICATE OF CORRECTION

PATENT NO.   : 5,629,571
DATED        : May 13, 1997
INVENTOR(S)  : Charles A. Roudeski It is certified that error appears in the above-indentified patent and that said Letters Patent is hereby corrected as shown below:

In column 2, line 8, please delete the number "0.9 Vpk" and replace it with -- 0.75 Vpk --.

In column 3, line 1, after the word "transistor 32", please add --, also referred to as the gate driver transistor 32,--.

Signed and Sealed this

Twenty-fifth Day of November, 1997

*Attest:*

BRUCE LEHMAN

*Attesting Officer*       *Commissioner of Patents and Trademarks*